(12) United States Patent
Hamamoto

(10) Patent No.: US 7,952,162 B2
(45) Date of Patent: May 31, 2011

(54) SEMICONDUCTOR DEVICE AND METHOD FOR MANUFACTURING THE SAME

(75) Inventor: Takeshi Hamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/541,449

(22) Filed: Aug. 14, 2009

(65) Prior Publication Data

US 2010/0181622 A1 Jul. 22, 2010

Related U.S. Application Data

(62) Division of application No. 11/561,580, filed on Nov. 20, 2006, now abandoned.

(30) Foreign Application Priority Data

Jan. 17, 2006 (JP) .................................. 2006-008638

(51) Int. Cl.
H01L 21/76 (2006.01)

(52) U.S. Cl. ................. 257/520; 257/508; 257/E21.585

(58) Field of Classification Search .................. 257/508, 257/520, E21.585
See application file for complete search history.

(56) References Cited

U.S. PATENT DOCUMENTS

| | | | |
|---|---|---|---|
| 4,477,310 A | | 10/1984 | Park et al. |
| 4,503,451 A | * | 3/1985 | Lund et al. .................... 257/374 |
| 4,922,318 A | | 5/1990 | Thomas et al. |
| 5,061,653 A | | 10/1991 | Teng |
| 5,148,247 A | | 9/1992 | Miura et al. |
| 5,859,466 A | | 1/1999 | Wada |
| 5,937,288 A | | 8/1999 | Alsmeier et al. |
| 6,121,651 A | * | 9/2000 | Furukawa et al. ............ 257/296 |
| 6,720,638 B2 | | 4/2004 | Tran |
| 6,781,212 B1 | | 8/2004 | Kao et al. |
| 6,888,214 B2 | * | 5/2005 | Mouli et al. ................... 257/510 |
| 7,239,003 B2 | * | 7/2007 | Mouli et al. ................... 257/510 |
| 2001/0035578 A1 | | 11/2001 | Liang et al. |
| 2001/0050388 A1 | | 12/2001 | Hamamoto |
| 2002/0160581 A1 | * | 10/2002 | Watanabe et al. ............. 438/430 |
| 2003/0209776 A1 | | 11/2003 | Desko et al. |
| 2003/0224566 A1 | | 12/2003 | Clampitt et al. |

(Continued)

FOREIGN PATENT DOCUMENTS

JP 63172459 7/1988

(Continued)

OTHER PUBLICATIONS

R. Ranica, et al., "A One Transistor Cell on Bulk Substrates (1T-Bulk) for Low-Cost and High Density eDRAM," 2004 Symposium on VLSI Technology Digest of Technical Papers, pp. 128-129.

(Continued)

*Primary Examiner* — David Vu
*Assistant Examiner* — Earl N Taylor
(74) *Attorney, Agent, or Firm* — Oblon, Spivak, McClelland, Maier & Neustadt, L.L.P.

(57) ABSTRACT

A semiconductor device of one embodiment of the present invention includes a substrate; isolation layers, each of which is formed in a trench formed on the substrate and has an insulating film and a conductive layer; a semiconductor layer of a first conductivity type for storing signal charges, formed between the isolation layers and isolated from the conductive layers by the insulating films; a semiconductor layer of a second conductivity type, formed under the semiconductor layer of the first conductivity type; and a transistor having a gate insulator film formed on the semiconductor layer of the first conductivity type and a gate electrode formed on the gate insulator film.

8 Claims, 7 Drawing Sheets

U.S. PATENT DOCUMENTS

2005/0285182 A1* 12/2005 Schuler .................. 257/315
2007/0241373 A1* 10/2007 Kuroi et al. ................ 257/288

FOREIGN PATENT DOCUMENTS

| JP | 63293938 | 11/1988 |
|---|---|---|
| JP | 2003-17691 | 1/2003 |

OTHER PUBLICATIONS

Kazumi Inoh, et al., "FBC (Floating Body Cell) for Embedded DRAM on SOI", 2003 Symposium on VLSI Technology Digest of Technical Papers, 4-89114-033-X, Jun. 2003, pp. 63-64.

* cited by examiner

SEMICONDUCTOR DEVICE AND METHOD FOR MANUFACTURING THE SAME

CROSS REFERENCE TO RELATED APPLICATIONS

This application is a division of and claims the benefit of priority under 35 U.S.C. §120 from U.S. Ser. No. 11/561,580 filed Nov. 20, 2006, and claims the benefit of priority under 35 U.S.C. §119 from Japanese Patent Application No. 2006-008638 filed on Jan. 17, 2006, the entire contents of each of which are incorporated herein by reference.

BACKGROUND OF THE INVENTION

1. Field of the Invention

This invention relates to a semiconductor device and method for manufacturing it, for example to a semiconductor memory device including capacitorless DRAM memory cells and a method for manufacturing it.

2. Related Art

A conventional DRAM memory cell of a DRAM includes a capacitor for storing signal charges and a switching transistor (for example, a MOSFET or other FETs). Capacitance of the capacitor required to store signal charges is generally about 30 fF. It is necessary to keep this capacitance of the capacitor of about 30 fF for a DRAM to maintain stable operation, even if the reduced design rule for the DRAM is adopted due to improvement in a degree of cell integration. Therefore, the DRAM memory cell of a conventional DRAM generally have required process improvement for miniaturizing a capacitor, such as thinning an insulating film for a capacitor of stack type or trench type.

On the contrary, a capacitorless DRAM has been proposed. In a DRAM memory cell of the capacitorless DRAM, a transistor (for example, a MOSFET or other FETs) is necessary, but a capacitor is not required. Therefore, the DRAM memory cell of the capacitorless DRAM may have less possibility to hinder improvement in a degree of cell integration.

The field of applications of capacitorless DRAM memory cells includes, for example an embedded device with both a logic device and memory device embedded. It is advantageously possible to realize a large-scale embedded device by adopting capacitorless DRAM memory cells while reducing the number of processes for manufacturing memory cells.

The capacitorless DRAM memory cell has two types of a memory cell, one formed on an SOI substrate and the other formed on a bulk substrate such as a bulk silicon substrate. The memory cell on the SOI substrate is disclosed in Japanese Patent Laid-Open No. 2002-246571, and the memory cell on the bulk substrate such as the bulk silicon substrate is disclosed in "Symposium on VLSI Technology Digest of Technology Paper" by R. Ranica, et al., 2004.

A typical example of the memory cell on a bulk silicon substrate will be described. On the bulk silicon substrate, there typically exist a gate electrode and a gate oxide film which constitute a MOSFET. In the bulk silicon substrate, there typically exist a p-type well (Pwell) under the MOSFET and an n-type well (Nwell) under the Pwell.

The Pwell stores holes which are signal charges. The phenomenon that the threshold voltage of a MOSFET varies depending on whether holes exist or not may be used to realize a memory cell. The Pwell includes the Nwell underneath and STIs on sides thereof, since it is necessary, for each MOSFET (each memory cell) to be isolated from neighboring MOSFETs, that Pwell be isolated for each MOSFET (each memory cell).

An amount of the signal of a memory cell on the bulk silicon substrate $\delta Vth$ is specified in the following expression (1):

$$\delta Vth \propto Cpn/Cgate \qquad (1).$$

Where Cgate is the capacitance between the gate electrode and the Pwell, and Cpn is the capacitance between the Pwell and Nwell.

The amount of the signal $\delta Vth$ represents difference between the threshold voltage of the MOSFET in the case of existence of holes and that in the case of nonexistence. The capacitance Cpn between the Pwell and Nwell corresponds to depletion layer capacitance of p-n junction formed by the Pwell and Nwell. The expression (1) above may be transformed to the expression (2) which specifies an amount of the signal of a memory cell on an SOI substrate $\delta Vth$ by substituting the capacitance Cpn between the Pwell and Nwell by capacitance Csoi between the upper portion and lower portion of an SOI insulating film.

$$\delta Vth \propto Csoi/Cgate \qquad (2).$$

Therefore, an increase in the capacitance Csoi may increase $\delta Vth$, the amount of the signal of the memory cell on the SOI substrate, and an increase in the capacitance Cpn may increase $\delta Vth$, the amount of the signal of the memory cell on the bulk substrate. For the SOI substrate, the capacitance Csoi due to a BOX oxide film (an SOI insulating film) of a thickness of, for example about 25 nm may allow the optimal amount of the signal $\delta Vth$ to be obtained. However, for the bulk substrate, it is difficult to accomplish the optimal amount of signal $\delta Vth$, since the amount of the capacitance Cpn is small.

SUMMARY OF THE INVENTION

An embodiment of the present invention is a semiconductor device including, for example, a substrate; isolation layers, each of which is formed in a trench formed on the substrate and has an insulating film and a conductive layer; a semiconductor layer of a first conductivity type for storing signal charges, formed between the isolation layers and isolated from the conductive layers by the insulating films; a semiconductor layer of a second conductivity type, formed under the semiconductor layer of the first conductivity type; and a transistor having a gate insulator film formed on the semiconductor layer of the first conductivity type and a gate electrode formed on the gate insulator film.

An embodiment of the present invention is a method for manufacturing a semiconductor device including, for example, forming trenches for isolation, on a substrate; forming isolation layers, each of which has an insulating film and a conductive layer, in the trenches; forming a semiconductor layer of a first conductivity type for storing signal charges between the isolation layers so that the semiconductor layer of the first conductivity type is isolated from the conductive layers by the insulating films; forming a semiconductor layer of a second conductivity type under the semiconductor layer of the first conductivity type; and forming a transistor having a gate insulator film formed on the semiconductor layer of the first conductivity type and a gate electrode formed on the gate insulator film.

DETAILED DESCRIPTION OF THE INVENTION

First Embodiment

Figure 1:
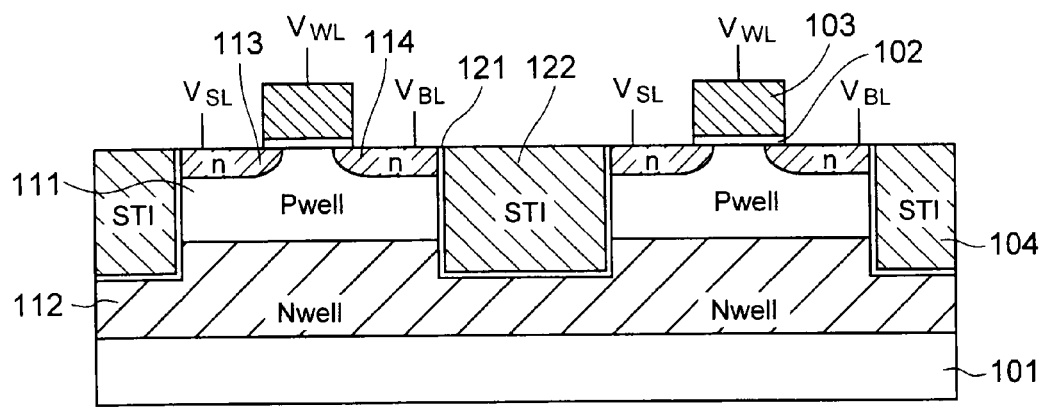
FIG. 1 is a side cross-sectional view of a semiconductor memory device according to a first embodiment of the present invention.

FIG. 1 is a side cross-sectional view of a semiconductor memory device according to a first embodiment. The semiconductor memory device shown in FIG. 1 includes capacitorless DRAM memory cells. A transistor constituting the DRAM memory cell shown in FIG. 1 is an FET (here, a MOSFET).

The semiconductor memory device shown in FIG. 1 includes a substrate 101, a gate oxide film 102 constituting the MOSFET, a gate electrode 103 constituting the MOSFET, a plurality of rows of STIs (Shallow Trench Isolations) 104 corresponding to a particular example of isolation layers for isolating MOSFET from one another. The gate oxide film 102 is a particular example of a gate insulator film of the transistor, and the gate electrode 103 is a particular example of a gate electrode of the transistor.

The substrate 101 is a bulk substrate (here, a bulk silicon substrate). The substrate 101 includes a p-type well (Pwell) 111 for storing signal charges corresponding to a particular example of a semiconductor layer of a first conductivity type, an n-type well (Nwell) 112 corresponding to a particular example of a semiconductor layer of a second conductivity type, a source region 113, and a drain region 114. The Pwell 111 is formed under the MOSFET for storing signal charges. The Nwell 112 is formed under the Pwell 111 for isolating Pwell 111 for each MOSFET from one another. STIs 104 are formed on sides of the Pwell 111 for isolating the Pwells for each MOSFET from one another. The Pwell 111 is formed between STIs 104, and the Nwell 112 is formed under STIs 104 and the Pwell 111. The gate oxide film 102 is formed on the Pwell 111, and the gate electrode 103 is formed on the gate electrode 102.

Figure 2:
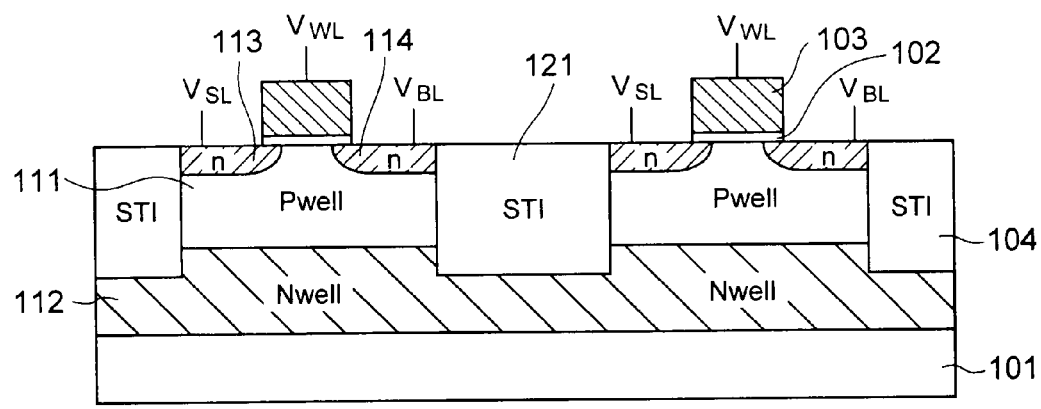
FIG. 2 is a side cross-sectional view of a semiconductor memory device shown as a comparative example.

The semiconductor memory device in FIG. 1 (the first embodiment) will be compared to a semiconductor memory device in FIG. 2 (a comparative example). Both the semiconductor memory device in FIG. 1 and the semiconductor memory device in FIG. 2 have each of STIs 104 formed in a trench for each STI 104 formed on the substrate 101, however, in the semiconductor memory device in FIG. 1, each STI 104 has an insulating film 121 and a conductive layer 122, and on the contrary, in the semiconductor memory device in FIG. 2, each STI 104 has only an insulating film 121. In FIG. 1, the insulating film 121 provides most of an outer envelope of the STI 104 and the conductive layer 122 provides most of a core portion of the STI 104. In FIG. 1, the insulating film 121 intervenes between the conductive layer 122 and the Pwell 111, isolating the conductive layer 122 from the Pwell 111. In FIG. 1, the Pwell 111 is opposite through the insulating film 121 to the conductive layer 122 and is isolated from the conductive layer 122 by the insulating film 121. Therefore, with regard to the semiconductor memory device in FIG. 1, an amount of the signal of a memory cell δVth is specified in the following expression (3), and also, with regard to the semiconductor memory device in FIG. 2, that is specified in the following expression (4):

$$\delta V_{th} \propto (C_{pn}+C_{sti})/C_{gate} \quad (3),$$

$$\delta V_{th} \propto (C_{pn})/C_{gate} \quad (4).$$

Figure 3:
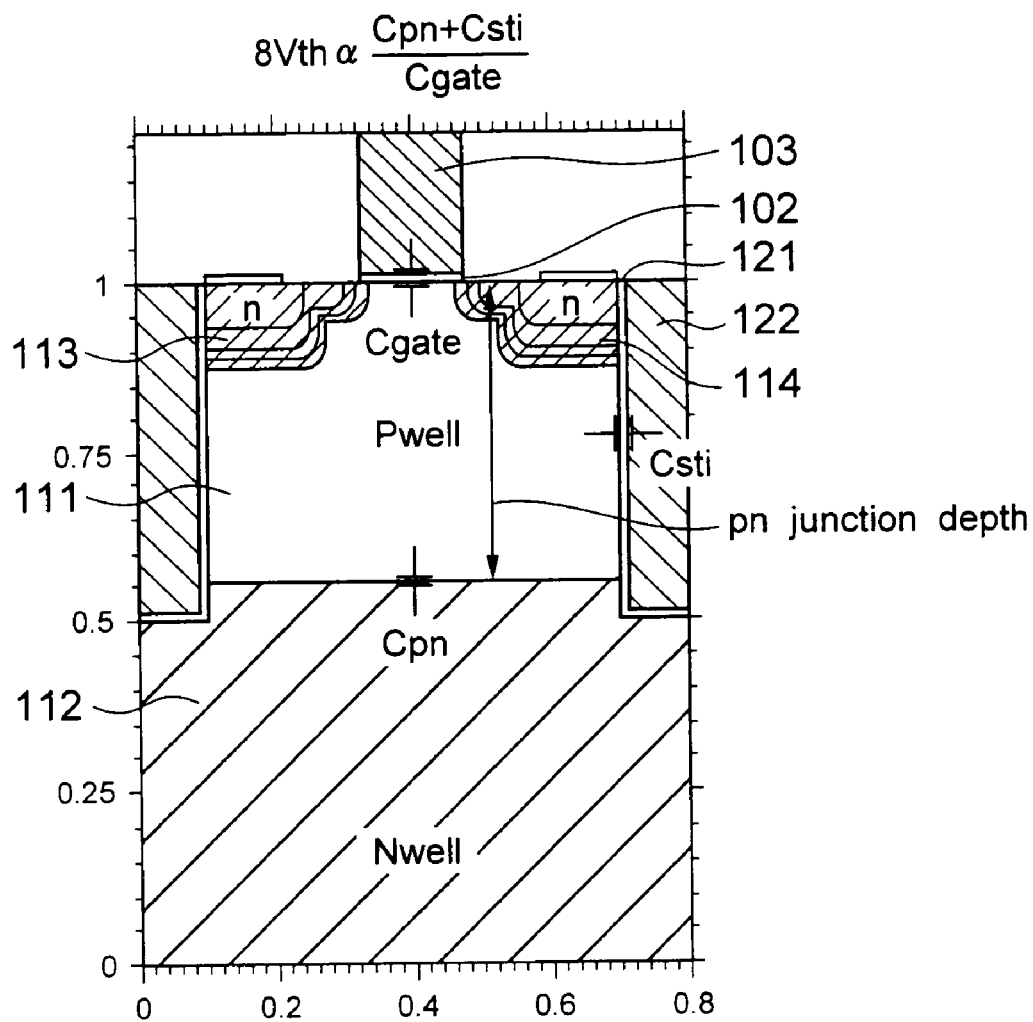
FIG. 3 is a schematic diagram illustrative of an amount of a signal and capacitance of the first embodiment.
Figure 4:
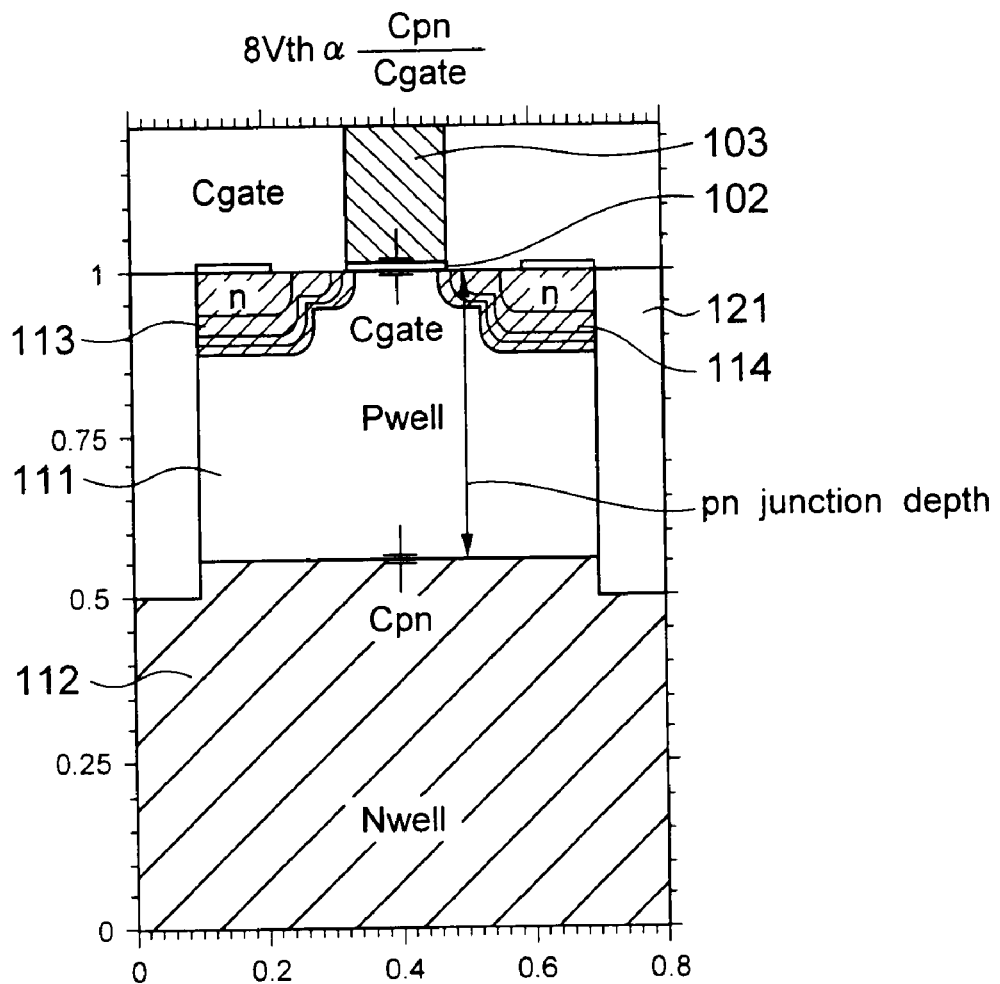
FIG. 4 is a schematic diagram illustrative of an amount of a signal and capacitance of the comparative example.

The capacitance Cgate corresponds to capacitance existing between the gate electrode 103 and the Pwell 111. The capacitance Cpn corresponds to capacitance existing between the Pwell 111 and the Nwell 112 (depletion layer capacitance of p-n junction). The capacitance Csti corresponds to capacitance between conductive layers 122 and the Pwell 111. The capacitances used in the expression (3) are represented in a schematic form in FIG. 3 as a view corresponding to an enlarged view of FIG. 1 and the capacitances used in expression (4) are represented in a schematic form in FIG. 4 as a view corresponding to an enlarged view of FIG. 2.

As can be seen from the expressions (3,4), in the semiconductor memory devices in FIGS. 1 and 2, an increase in the capacitance Cpn may allow for an increase in the amount of the signal δVth. However, it is difficult to accomplish the optimal amount of the signal δVth by increasing the capacitance Cpn because of the small amount of the capacitance Cpn.

As can be seen from the expression (3), in the semiconductor memory device in FIG. 1, an increase in the capacitance Csti may also allow for an increase in the amount of the signal δVth. Thus, it is easy to accomplish the optimal amount of the signal δVth by the increase of the capacitance Csti since varying the dielectric constant, a film thickness or a film area of the insulating film 121 changes the capacitance Csti.

Therefore, as such, in the first embodiment, STIs 104 having insulating films 121 and conductive layers 122 may increase the amount of the signal δVth of the memory cell constituting a semiconductor memory device. In the first embodiment, an increase in the amount of the signal δVth of the memory cell may also allow for stability securement of operation of the semiconductor memory device and improvement in yield of the semiconductor memory device.

In the semiconductor memory device in FIG. 1, insulating films 121, here, are formed of silicon oxide, and conductive layers 122, here, are formed of polycrystalline silicon. However, insulating films 121 may be also formed of material such as material with insulating properties rather than silicon oxide (for example, aluminum oxide, hafnium oxide and the like) and conductive layers 122 may be also formed of material such as conductive material rather than polycrystalline silicon (for example, silicon-germanium and the like). In view of setting a higher value of the capacitance Csti, it may be desirable that the dielectric constant of insulating films 121 are as high as possible and that the film thickness of insulating films 121 are as thin as possible (in the case of silicon oxide, about 8 nm in thickness). Further, it may be also advantageous to adopt silicon oxide for insulating films 121 and polycrystalline silicon for conductive layers 122 because of their approximately equal coefficients of expansion. Insulating films 121 of the semiconductor memory device in FIG. 2, here, are also formed of silicon oxide.

Figure 5:
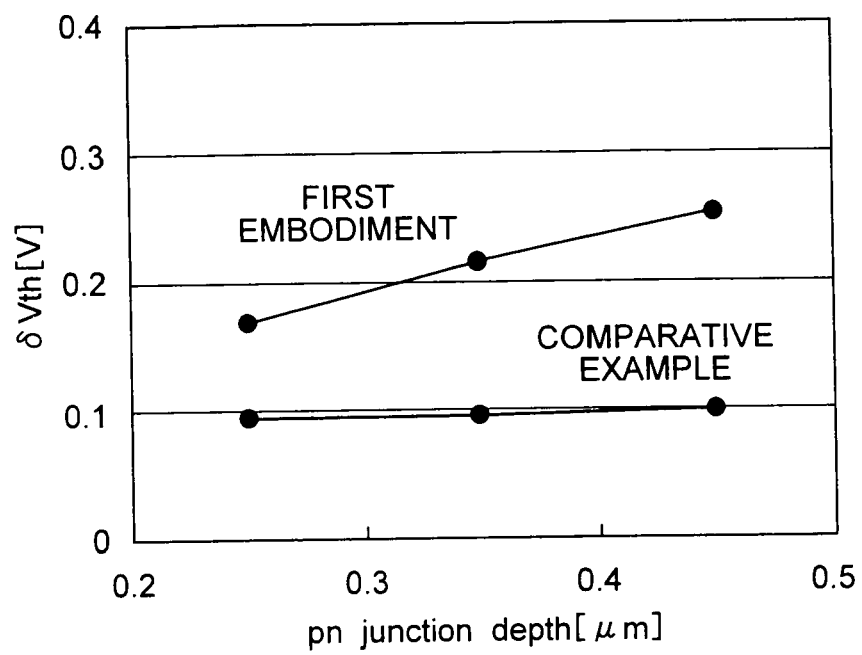
FIG. 5 shows calculation result of the amount of the signal derived from simulation.

In FIG. 5, calculation result of the amount of the signal δVth of the semiconductor memory device in FIG. 1 (the first embodiment) and the semiconductor memory device in FIG. 2 (the comparative example) calculated by using simulation is shown. The vertical axis in FIG. 5 represents the amount of the signal. The lateral axis in FIG. 5 represents a depth of p-n junction plane (a distance from the surface of the substrate 101 to the p-n junction plane at which the Pwell 111 and the Nwell 112 contact one another, see FIG. 3 and FIG. 4). It can be seen that the amount of the signal of the first embodiment is larger than that of the comparative example. Further, it is appreciated that the amount of the signal of the comparative example does not vary responding to an increase in the depth of the p-n junction plane, and however, the amount of the signal of the first embodiment increases in response to an increase in the depth of the p-n junction plane. This results from an increase in the capacitance Csti in the first embodiment, caused by an increase in a film area of insulating films 121 according to the increase in depth of the p-n junction plane.

Figure 6:
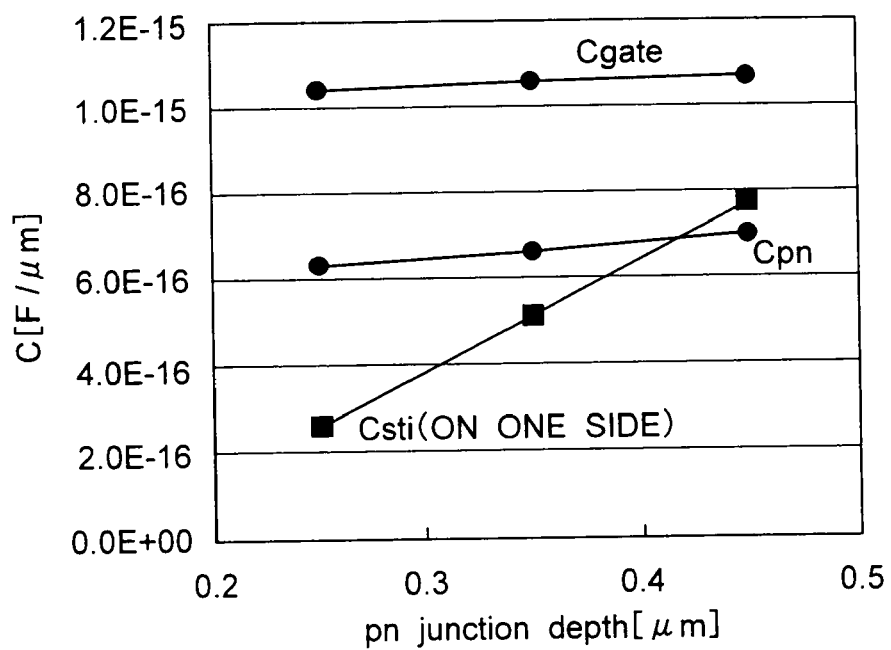
FIG. 6 shows calculation result of the capacitances derived from simulation.
Figure 7:
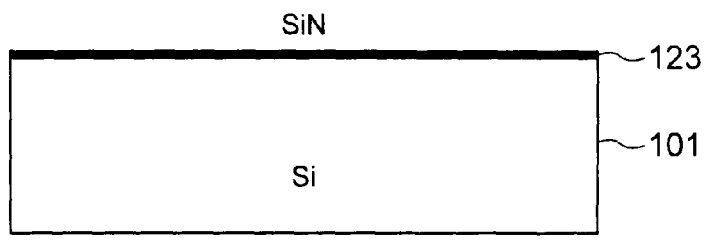
FIGS. 7(A) to (E) show side cross-sectional views of the semiconductor memory device of the first embodiment, illustrating a method for manufacturing it.
Figure 7:
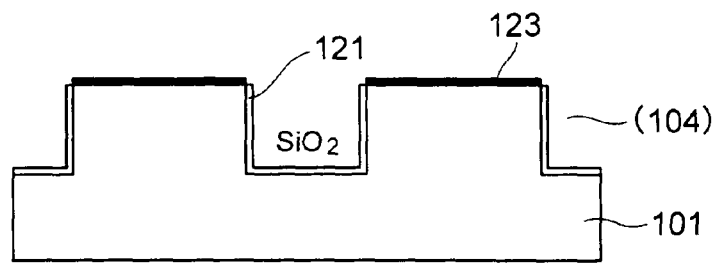
Figure 7:
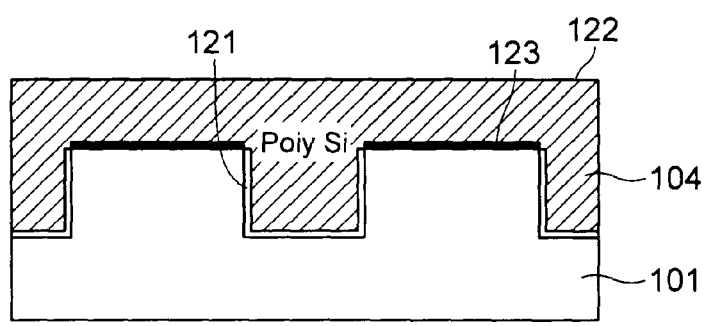
Figure 7:
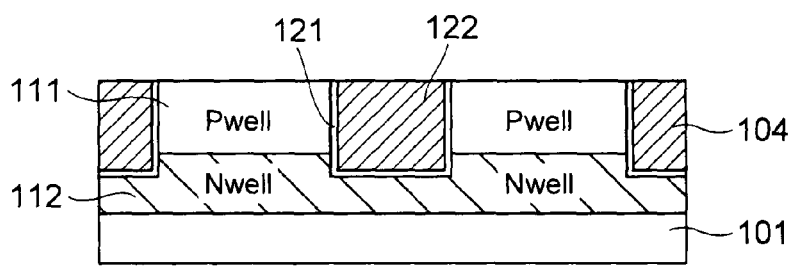
Figure 7:
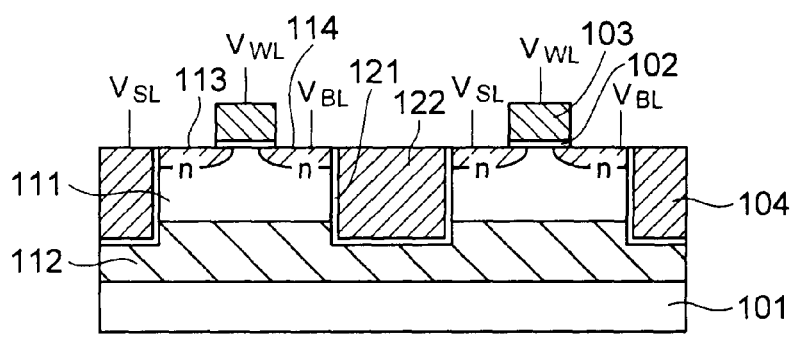

In FIG. 6, calculation result of the capacitance Cgate, the capacitance Cpn and the capacitance Csti of the semiconductor memory device in FIG. 1 (the first embodiment) and the semiconductor memory device in FIG. 2 (the comparative example) calculated by using simulation is shown. The calculated data in FIG. 6 commonly applies to both the first embodiment and the comparative example. The calculated data in FIG. 6 forms the basis for calculation in FIG. 5. It can be understood from the calculated data in FIG. 6 that as the depth of the p-n junction plane increases, the capacitance Csti increases accordingly.

In the semiconductor memory device in FIG. 1, also, conductive layers 122, here, are connected to fixed potential. Conductive layers 122, here, especially from the point of view of suppressing degradation of electric strength of isolation, are connected to earth potential, and then the potential of conductive layers 122 is fixed to 0 V. The data in FIGS. 5 and 6 is obtained from the simulation using the condition under which the potential of conductive layers 122 is fixed to 0 V.

FIGS. 7(A) to (E) show side cross-sectional views of the semiconductor memory device according to the first embodiment, illustrating a method for manufacturing it.

First, as shown in FIG. 7(A), a silicon nitride film 123 to be mask material for silicon etching process is deposited entirely on the surface of a silicon substrate 101. Subsequently, by using lithography and RIE (Reactive Ion Etching), a pattern for an element region of a memory cell is transferred onto the silicon nitride film 123 which is used as mask material for silicon etching process.

Next, as shown in FIG. 7(B), by using RIE with the silicon nitride film 123 being used as mask material for silicon etching, the silicon substrate 101 is etched to provide regions for forming STIs 104. This process provides trenches for forming STIs 104 on the silicon substrate 101. The trenches for STIs 104 are, for example 0.15 μm in width and, for example 0.30 μm in depth. Subsequently, surfaces (inside surfaces) of the trenches for STIs 104 are oxidized to form silicon oxide films (insulating films) 121 thereon.

Next, as shown in FIG. 7(C), a polycrystalline silicon layer (conductive layer) 122 is deposited entirely on the surface of the silicon substrate 104 to fill in the trenches for STIs 104 with the polycrystalline silicon layer 122. It is desirable to dope the polycrystalline silicon layer 122 with arsenic or other doping substances to make it exhibit n-type properties. It is noted that the polycrystalline silicon layer 122 is insulated electrically from the silicon substrate 101.

Next, as shown in FIG. 7(D), by using CMP (Chemical Mechanical Polishing), the polycrystalline silicon layer 122 on the surface of the silicon substrate 101 is planarized. As a result, the polycrystalline silicon layer 122 on the surface of the silicon substrate 101 (and also the silicon nitride film 123) is removed, so that polycrystalline silicon layers 122 in the trenches for STIs 104 remain therein. Then, in order to form the Pwell 111 between STIs 104, the silicon substrate 101 is ion implanted with boron, for example under the conditions of 60 KeV and $5 \times 10^{13}$ cm$^{-2}$. Then, in order to form the Nwell 112 under STIs 104 and the Pwell 111, the silicon substrate 101 is ion implanted with phosphorus, for example under the conditions of 240 KeV and $1 \times 10^{14}$ cm$^{-2}$.

Next, as shown in FIG. 7(E), a source region 113 and a drain region 114 are formed. Subsequently, to form an n-type MOSFET, a gate oxide film 102 of silicon oxide is formed on the Pwell 111, and a gate electrode 103 of polycrystalline silicon is formed on the gate oxide film 102. Therefore, an n-type MOSFET having a gate oxide film 102 and a gate electrode 103 is completed on the Pwell 111. Subsequently, the source region 113 is connected to a source line (SL), the drain region 114 is connected a bit line (BL) and the gate electrode 103 is connected a word line (WL).

Second Embodiment

Figure 8:
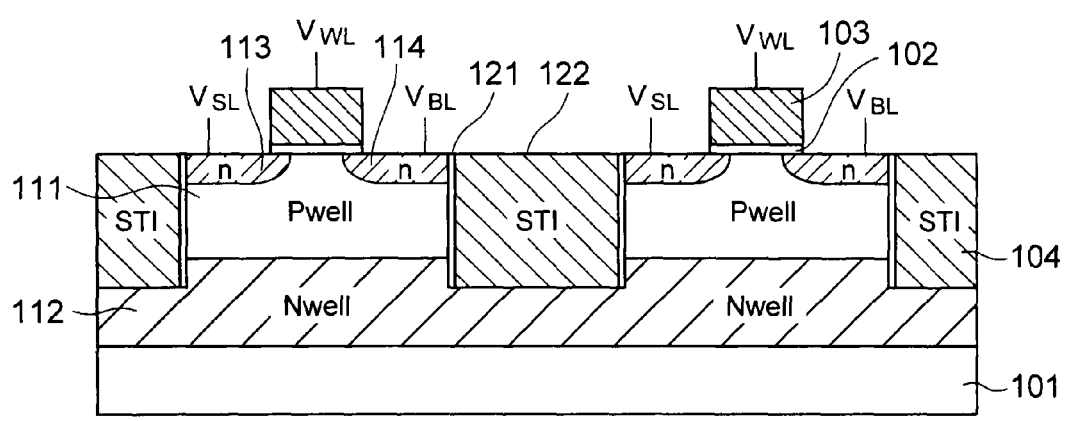
FIG. 8 is a side cross-sectional view of a semiconductor memory device according to a second embodiment of the present invention.
Figure 9:
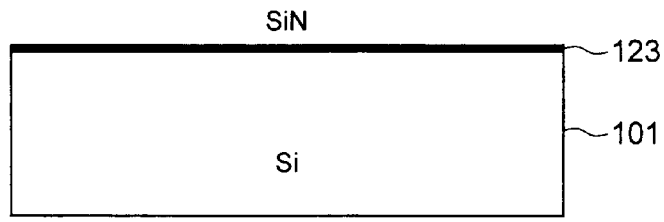
FIGS. 9(A) to (E) show side cross-sectional views of the semiconductor memory device of the second embodiment, illustrating a method for manufacturing it.
Figure 9:
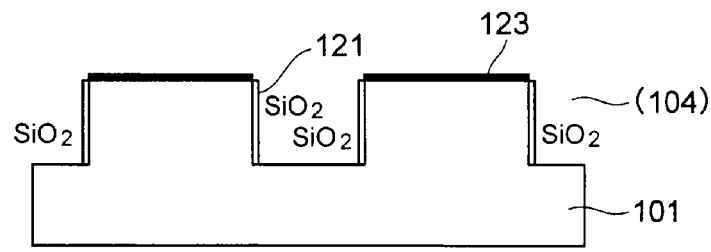
Figure 9:
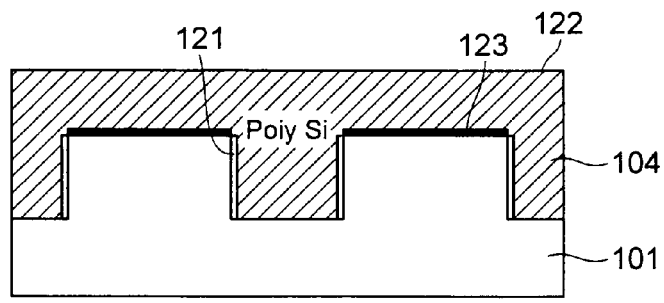
Figure 9:
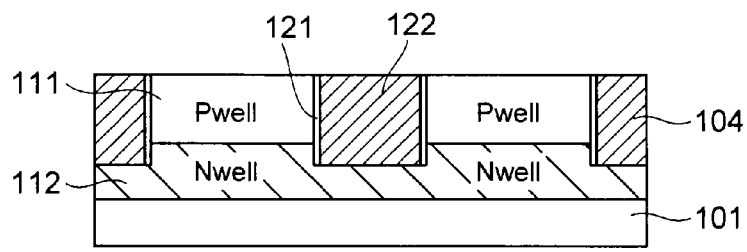
Figure 9:
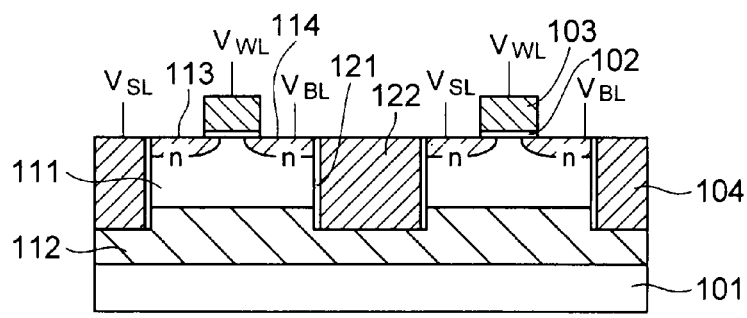

FIG. 8 is a side cross-sectional view of a semiconductor memory device of a second embodiment. Now, difference between the semiconductor memory device of the first embodiment in FIG. 1 and that of the second embodiment in FIG. 8 will be described.

In both the semiconductor memory devices in FIGS. 1 and 8, each STI 104 has an insulating film 121 and a conductive layer 122. However, in the semiconductor memory device in FIG. 1, each STI 104 has the bottom surface and the side surfaces formed by the insulating film 121, and on the contrary, in the semiconductor memory device in FIG. 8, each STI 104 has the side surfaces formed by the insulating film 121 and the bottom surface formed by the conductive layer 122. Therefore, in the semiconductor memory device in FIG. 1, the conductive layer 122 of each STI 104 is electrically insulated from the substrate 101, while in the semiconductor memory device in FIG. 8, the conductive layer 122 of each STI 104 is electrically connected to the substrate 101. Then, in the semiconductor memory device in FIG. 1, it is required, generally, for the conductive layer 122 of each STI 104 to be connected to fixed potential by another means to be adopted, and on the contrary, in the semiconductor memory device in FIG. 8, generally, it is not required for the conductive layer 122 of each STI 104 to be connected to fixed potential by another means to be adopted.

In such a manner, in the second embodiment, because conductive layers 122 and the substrate 101 (the Nwell 112 thereof) are electrically connected to one another, conductive layers 122 will have a stable potential. Therefore, in the second embodiment, the resultant improvement in resistance to noise, with regard to operation of the semiconductor memory device, may provide improvement in an operational margin of the semiconductor memory device.

FIGS. 9(A) to (E) show side cross-sectional views of the semiconductor memory device according to the second embodiment, illustrating a method for manufacturing it. Now, difference between the manufacturing method of the semiconductor memory device of the first embodiment in FIG. 7 and that of the second embodiment in FIG. 9 will be described.

The processes in FIGS. 9(A), (B), (C), (D) and (E) are carried out similarly to the processes in FIGS. 7(A), (B), (C), (D) and (E), respectively. The difference consists in how the manufacturing processes in FIGS. 9(B) and 7(B) end. The process in FIG. 7(B) ends after each silicon oxide film 121 is formed on the sides and bottom surface of the trench for the STI 104. While, the process in FIG. 9(B) ends after each silicon oxide film 121 is formed on the sides and bottom surface of the trench for the STI 104 and further, by RIE which uses the silicon nitride film 123 as mask material for silicon etching process, each silicon oxide film 121 affixed on the bottom surface of the trench for the STI 104 (i.e. a portion of each silicon oxide film 121) is removed. It is noted that in FIG. 7(C), each polycrystalline silicon layer 122 is electrically insulated from the silicon substrate 101, however, in FIG. 9(C), each polycrystalline silicon layer 122 is electrically connected to the silicon substrate 101.

In the process in FIG. 9(B), instead of removal of the entire portion of each silicon oxide film 121 on the bottom surface of the trench for the STI 104, only a portion of the silicon oxide film 121 on the bottom surface of the trench for the STI 104 may be also removed. In either the former case or the latter case, each conductive layer 122 and the substrate 101 may be configured to be electrically connected to one another. Further, in the process in FIG. 9(C), instead of contacting each conductive layer 122 with the substrate 101 to directly connect electrically to one another, each conductive layer 122 and the substrate 101 may be configured to indirectly connect electrically to one another without direct physical contact.

In such a manner, the embodiments of the present invention may provide the increase in the amount of the signal in a memory cell (for example, a DRAM memory cell and the like) constituting a semiconductor device (for example, a DRAM and the like).

What is claimed is:

1. A semiconductor device, comprising:
   a substrate;
   isolation layers, each of which is formed in a trench formed on the substrate and has an insulating film constituting sides of the isolation layer, and a conductive layer constituting a bottom surface of the isolation layer and electrically connected to the substrate;
   a semiconductor layer of a first conductivity type for storing signal charges, which is disposed between the isolation layers to be isolated from the conductive layers by the insulating films, and has a bottom surface whose height is higher than heights of the bottom surfaces of the isolation layers;
   a semiconductor layer of a second conductivity type, which is disposed under the semiconductor layer of the first conductivity type to contact the bottom surface of the semiconductor layer of the first conductivity type and the bottom surfaces of the isolation layers; and
   a transistor having a gate insulator film formed on the semiconductor layer of the first conductivity type and a gate electrode formed on the gate insulator film.

2. The semiconductor device according to claim 1, wherein the insulating film constitutes an outer envelope of the isolation layer, and the conductive layer constitutes a core portion of the isolation layer.

3. The semiconductor device according to claim 1, wherein the insulating film intervenes between the conductive layer and the semiconductor layer of the first conductivity type and isolates the conductive layer from the semiconductor layer of the first conductivity type.

4. The semiconductor device according to claim 1, wherein the conductive layer is opposite through the insulating film to the semiconductor layer of the first conductivity type and isolated from the semiconductor layer of the first conductivity type by the insulating film.

5. The semiconductor device according to claim 1, wherein the insulating film is formed of a silicon oxide film, and the conductive layer is formed of polycrystalline silicon.

6. The semiconductor device according to claim 1, wherein the semiconductor layer of the first conductivity type is a p-type well, and the semiconductor layer of the second conductivity type is an n-type well.

7. The semiconductor device according to claim 1, wherein the substrate is a bulk substrate.

8. The semiconductor device according to claim 1, wherein the transistor is a transistor constituting a capacitorless memory cell.

* * * * *